United States Patent [19]
Kim et al.

[11] Patent Number: 5,844,914
[45] Date of Patent: Dec. 1, 1998

[54] TEST CIRCUIT AND METHOD FOR REFRESH AND DESCRAMBLING IN AN INTEGRATED MEMORY CIRCUIT

[75] Inventors: Heon-Cheol Kim; Hong-Sin Jun; Chang-Hyun Cho, all of Suwon, Rep. of Korea

[73] Assignee: Samsung Electronics, Co. Ltd., Suwon, Rep. of Korea

[21] Appl. No.: 850,807

[22] Filed: May 2, 1997

[30]     Foreign Application Priority Data

May 15, 1996 [KR] Rep. of Korea ................. 1996 16305
May 15, 1996 [KR] Rep. of Korea ................. 1996 16306

[51] Int. Cl.⁶ .................................................. G06F 11/00
[52] U.S. Cl. ......................................................... 371/21.1
[58] Field of Search ............................ 371/21.1, 21.2, 371/21.3, 21.6; 711/170, 211, 212; 395/307, 310

[56]     References Cited

U.S. PATENT DOCUMENTS 5,737,748  4/1998  Shigeeda ................................... 371/21
5,737,764  4/1998  Shigeeda ................................. 395/307

*Primary Examiner*—Vincent P. Canney
*Attorney, Agent, or Firm*—Marger, Johnson, McCollom, P.C.

[57]     ABSTRACT

A semiconductor memory device and method is shown in which a built-in system test (BIST) circuit determines, based upon the test algorithm and the refresh requirements of a DRAM memory cell array, a refresh point address where the BIST circuit performs a refresh operation on the test data in the memory cell array when the test address reaches the refresh point address. Another embodiment of a semiconductor memory device and method is also shown in which a BIST circuit descrambles the test address and test data before input to a memory circuit which includes address and data scrambling circuits such that the logical test address and test data generated according to a test algorithm matches the physical address and data in the memory cell array.

8 Claims, 6 Drawing Sheets

Fig. 2
*(PRIOR ART)*
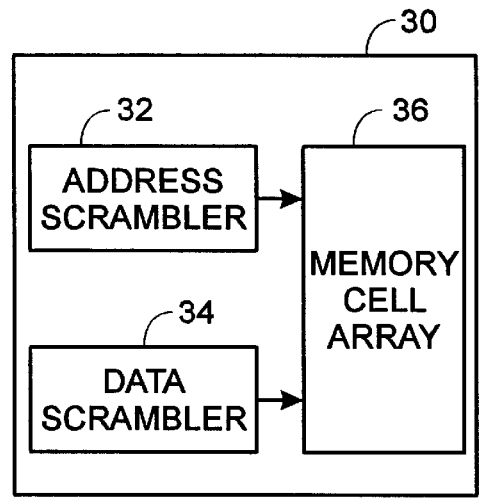
Fig. 3A
*(PRIOR ART)*
Fig. 3B
*(PRIOR ART)*
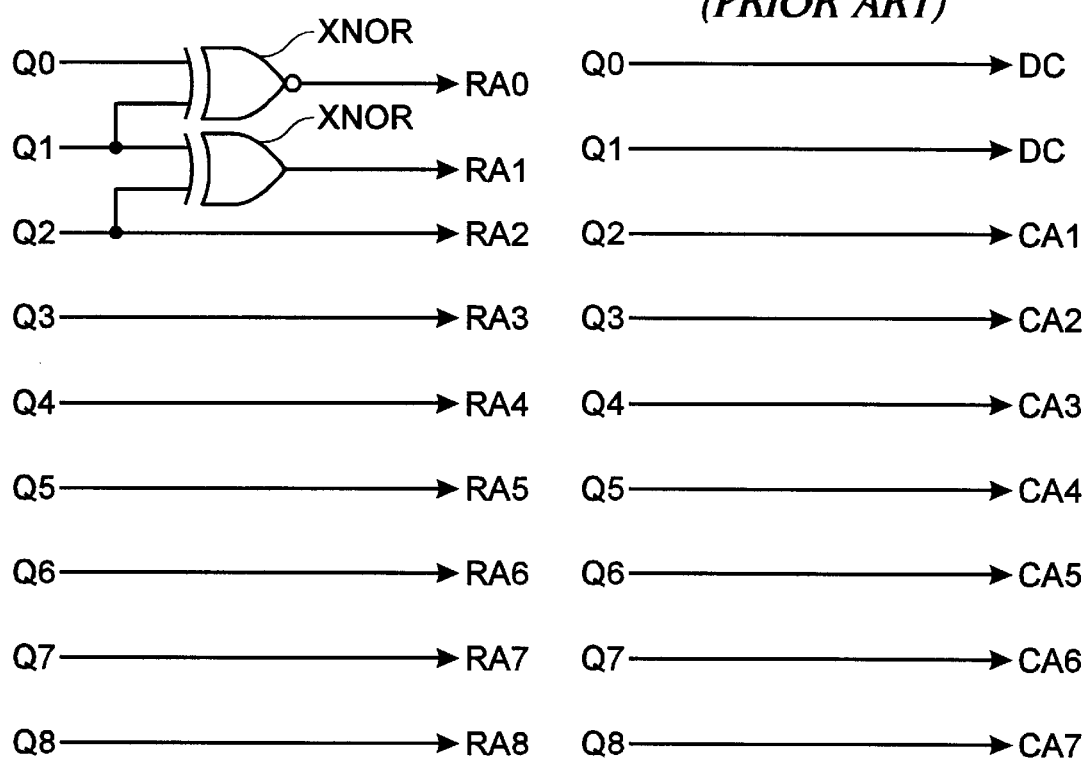
Fig. 4
*(PRIOR ART)*

TEST CIRCUIT AND METHOD FOR REFRESH AND DESCRAMBLING IN AN INTEGRATED MEMORY CIRCUIT

BACKGROUND OF THE INVENTION

The present invention relates generally to a semiconductor integrated circuit having a test circuit. In particular, the present invention relates to a semiconductor memory circuit wherein a built-in self test (BIST) type test circuit section and a memory circuit section are fabricated onto a single chip for the improvement of the refresh mode and for the suitable generation of addresses and data for testing the memory circuit section.

With the development of the high speed, multi-function, and large-scale semiconductor memory devices, the test techniques used for semiconductor memory chips during the manufacturing process have become increasingly important. In a conventional test process, a semiconductor memory chip is mounted on a test platform and the pads of the chip are connected to a set of probes on the test platform. Thereafter, data and addresses for testing the chip are applied from the test platform to the chip through the probes. The conventional test technique, however, has the drawback that the manufacturing cost per chip is increased with the limitations of the chip design and the complexity of the test process since the address, data, and control signals for testing the chip are externally applied to the chip and dedicated testing pads must be provided on the chip. A further drawback is that, though testing of the chip is possible during manufacturing, it is not possible to test the packaged chip because external probes cannot be connected to the test pads after the chip is packaged.

Built-in self test (BIST) techniques are now being increasingly used for testing large scale memory chips. Since both the memory circuit section and the BIST circuit section are fabricated onto the same chip, the efficiency of the testing process is improved and chip testing after packaging is possible.

FIG. 1 is a block diagram illustrating the structure of a conventional semiconductor memory device having a BIST circuit. Referring to FIG. 1, the conventional semiconductor memory device is composed of a test circuit section 10 and a memory circuit section 30. The test circuit section 10 includes a stage counter 12, a refresh counter 14, a BIST control section 16, an address generating section 18, a data generating section 20, a BIST error detecting section 22, a comparing section 24, and a multiplexer section 26.

The stage counter 12 counts through the steps of a test algorithm. For example, in the case of a march test algorithm having 6 steps, stage counter 12 will count through the values 0 to 5. The refresh counter 14 is a counter which counts the addresses in a refresh operation for refreshing memory cells when the memory circuit section is a dynamic memory device 30. The address generating section 18 contains a counter for generating test addresses for the memory circuit section 30. An example of the address for the memory circuit section 30 is 16 bits, wherein the upper 7 bits thereof are used for a row address, and the lower 9 bits thereof are used for a column address. The upper 2 bits of the column address are dummy bits and the lower 7 bits thereof are generated by the counter. The selection of the row and column addresses is controlled by the BIST control section 16. The data generating section 20 generates data to be written in the memory circuit section 30 and generates the output values that are expected for comparison with the data read from memory circuit section 30.

The multiplexer section 26 is also controlled by the BIST control section 16 and is used to switch the addresses and data provided to the memory circuit section between either the addresses provided from the address generating section 18 and the data provided from the data generating section 20, for output to the memory during testing mode, or the external address and external data, during normal operating mode. The BIST error detecting section 22 is a circuit for detecting errors existing in the test circuit itself. The comparing section 24 compares the data from the data generating section 20 with the data read out from the memory circuit section 30, or compares a signal provided from the BIST control section 16 with a signal provided from the BIST error detecting section 22. The BIST control section 16 is enabled in response to an external BIST enable signal and controls the operation of the blocks of BIST circuit section 10 in response to the clock signal.

The BIST operation is composed of the combined processes of writing data to cells in the memory circuit section 30 and reading data from those cells. The memory circuit section 30 should normally maintain the data stored while the BIST is performed. However, in the event that a cell in the memory circuit section has not been accessed within a predetermined time while the testing operation is performed, a refresh operation must be performed to preserve the test data stored in the cell. Therefore, the BIST circuit must also include refresh circuitry.

The refresh counter of the conventional BIST circuit, however, simply performs a refresh operation on the entire memory circuit section under the control of the BIST control section, the result being that an accurate and effective refresh operation is difficult to achieve.

Further, the address and data generation sections of the conventional test circuit are merely up/down counters. Generally, in order to increase the integrity of the chip, the memory circuit section 30, as shown in FIG. 2, is designed to scramble the EXTERNAL ADDRESS and EXTERNAL DATA input to the memory device through an address scrambler 32 and a data scrambler 34 so that scrambled addresses and data are written into and read out from the memory cell array 36.

FIGS. 3A and 3B illustrate the detailed circuit construction of the address scrambler 32, and FIG. 4 illustrates the structure of the data scrambler 34. In FIG. 3A, a 9-bit row address scrambler is constructed from a XNOR gate for performing an exclusive-NOR on the lower 2 bits Q0 and Q1 of the 9-bit external address lines Q0–Q8 to produce the least significant row address bit signal RA0, and a XOR gate for performing an exclusive-OR on the next lower 2 bits Q1 and Q2 to produce the row address bit signal RA1. Other incoming address signals Q2, Q3, Q4, Q5, Q6, Q7, and Q8 are connected as row address bit signals RA2, RA3, RA4, RA5, RA6, RA7, and RA8, respectively. The column address scrambler of FIG. 3B outputs the external address signals Q2, Q3, Q4, Q5, Q6, Q7, and Q8 as column address bit signals CA1, CA2, CA3, CA4, CA5, CA6, and CA7, respectively. The data scrambler 34 of FIG. 4 is constructed of another exclusive NOR gate XNOR to perform an exclusive-NOR function on each bit of EXTERNAL DATA together with RA0 to produce a data input signal DATA IN CELL to be input to the memory cell array 36.

As a result, if the address and data are produced using only the up/down counter in the test circuit section 10, an effective test factor for testing the memory circuit section 30 cannot be created. In other words, in order to construct an effective BIST circuit, the scrambling information must be considered.

SUMMARY OF THE INVENTION

It is an object of the present invention to solve the problems involved in the prior art, and to provide a semiconductor integrated circuit having a test circuit which can effectively refresh a memory circuit section at a proper time in the testing operation.

It is another object of the present invention to provide a test method for a semiconductor integrated circuit having a test circuit capable of performing an efficient and effective refresh during the testing operation.

It is still another object of the present invention to provide a semiconductor integrated circuit having a test circuit which can produce addresses and data for testing the integrated circuit that takes into consideration the data and address scrambling function of a memory circuit section.

One embodiment of a semiconductor integrated circuit having a test circuit section and a memory circuit section, according to the present invention includes an address generating circuit configured to generate a testing address for testing the memory circuit section, a data generating circuit configured to generate test data for testing the memory circuit section, a refresh address generating circuit configured to generate a refresh address for refreshing the memory circuit section when the generated address matches a refresh point address, an address multiplexer configured to select one of the test address and the refresh address responsive to an address control signal, and a built-in self test control circuit configured to execute a predetermined test algorithm and control the address generating circuit and the data generating circuit responsive to the test algorithm. The control circuit is further configured to determine whether a time period for accessing a cell of said memory circuit section is greater than a predetermined refresh time required for the memory circuit section and to calculate a corresponding refresh point address. The control circuit is also configured to compare the test address to the refresh point address and disable the address generating circuit and enable the refresh address generating circuit when the test address matches the refresh point address. The control circuit also provides the address control signal to the address multiplexer such that the test address is output to the memory circuit section when said address generating circuit is enabled and the refresh address is output to the memory circuit section when said refresh address generating circuit is enabled.

Another embodiment of a semiconductor integrated circuit according to the present invention includes a memory circuit section having an address scrambling circuit and a data scrambling circuit. A test circuit section coupled to the memory circuit section includes an address counting circuit and an address descrambling circuit adapted to descramble the test address output from the address counting circuit to produce a descrambled test address which is provided as the input address signal to the address scrambling circuit of the memory circuit section such that the test address matches the address of the memory cell array. The test circuit section also has a data generating circuit and a data descrambling circuit adapted to descramble the test data output from the data generating circuit to produce the input data signal to the memory circuit section such that the test data matches the data stored in the memory cell array for a given test address. The test circuit section is controlled by a built-in self test (BIST) control circuit enabled by an external test enable signal, and operating in response to an external clock signal, wherein the BIST control circuit executes a test algorithm on the memory circuit section by controlling the address counting circuit and the data generating circuit in accordance with the test algorithm.

An embodiment of a test method according to the present invention for a semiconductor integrated circuit having a test circuit section and a memory circuit section involves calculating a refresh point address based upon a time period required to complete a predetermined test algorithm on the memory circuit section and a predetermined refresh time required to maintain data stored in the memory circuit section. The method further calls for generating a test address and test data for testing a cell in the memory circuit section, comparing the test address with the refresh point address, holding the test address when the test address matches the refresh point address, performing a refresh operation to refresh the data stored in memory circuit section beginning with the refresh point address when the test address matches the refresh point address, and resuming the test algorithm at the test address after termination of the refresh operation.

Another embodiment of a test method according to the present invention for a semiconductor integrated circuit having a test circuit section and a memory circuit section, wherein the memory circuit section includes logic for scrambling an address and a data signal input to the memory circuit section, involves generating a test address and test data for testing a cell in the memory circuit section, descrambling the test address before inputting the test address into the memory circuit section, and descrambling the test data before inputting the test data into the memory circuit section.

BRIEF DESCRIPTION OF THE DRAWINGS

The above objects, and other features and advantages of the present invention will become more apparent by describing the preferred embodiments thereof with reference to the accompanying drawings, in which:

FIG. 2 is a block diagram of the memory circuit section of the conventional semiconductor memory device of FIG. 1;

FIGS. 3A and 3B are schematic circuit diagrams of an address scrambler of the semiconductor memory device of FIG. 2;

FIG. 4 is a schematic circuit diagram of a data scrambler of the semiconductor memory device of FIG. 2;

DETAILED DESCRIPTION OF PREFERRED EMBODIMENTS

Figure 1:
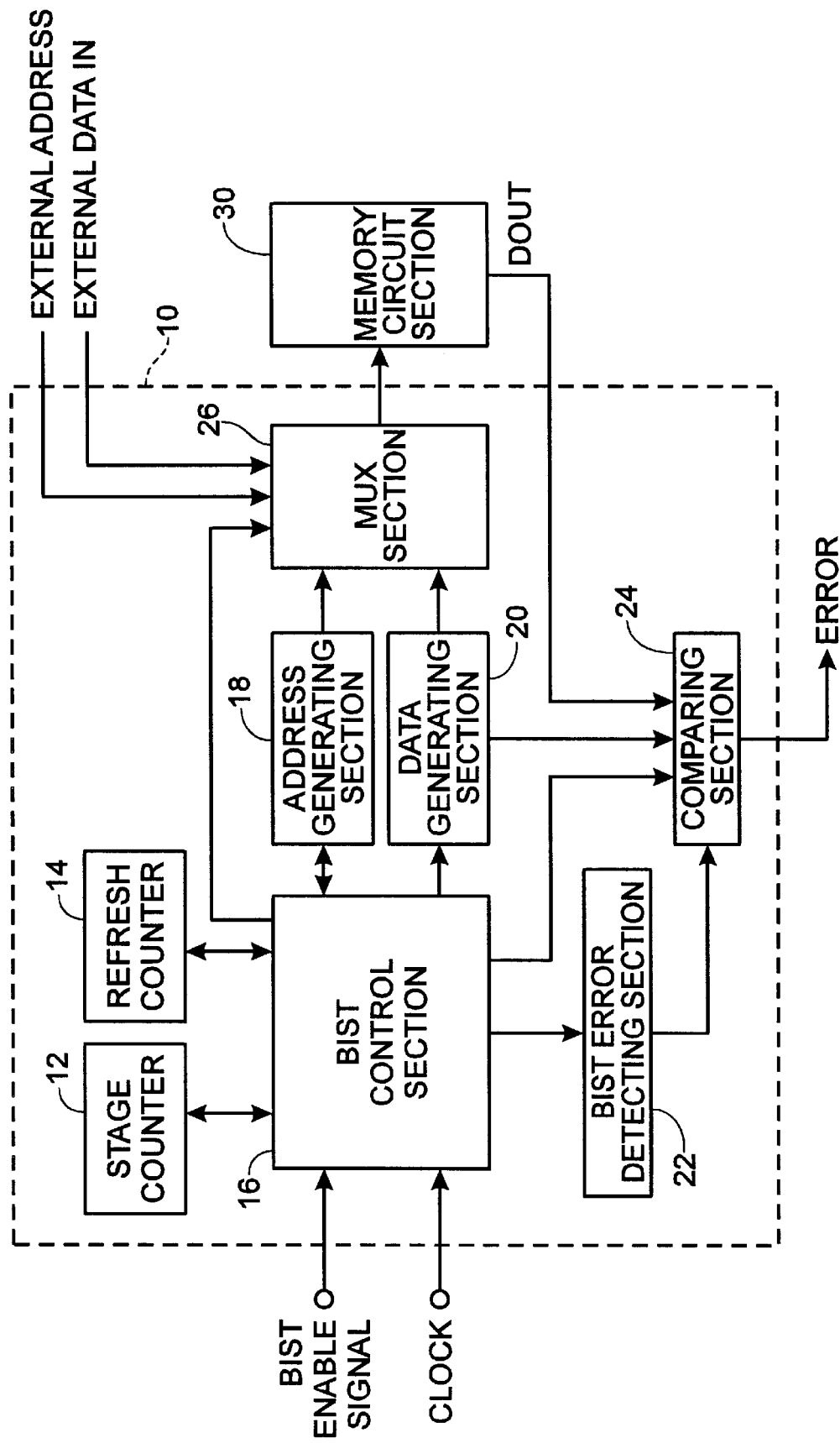
FIG. 1 is a block diagram of a conventional semiconductor memory device having a test circuit.
Figure 5:
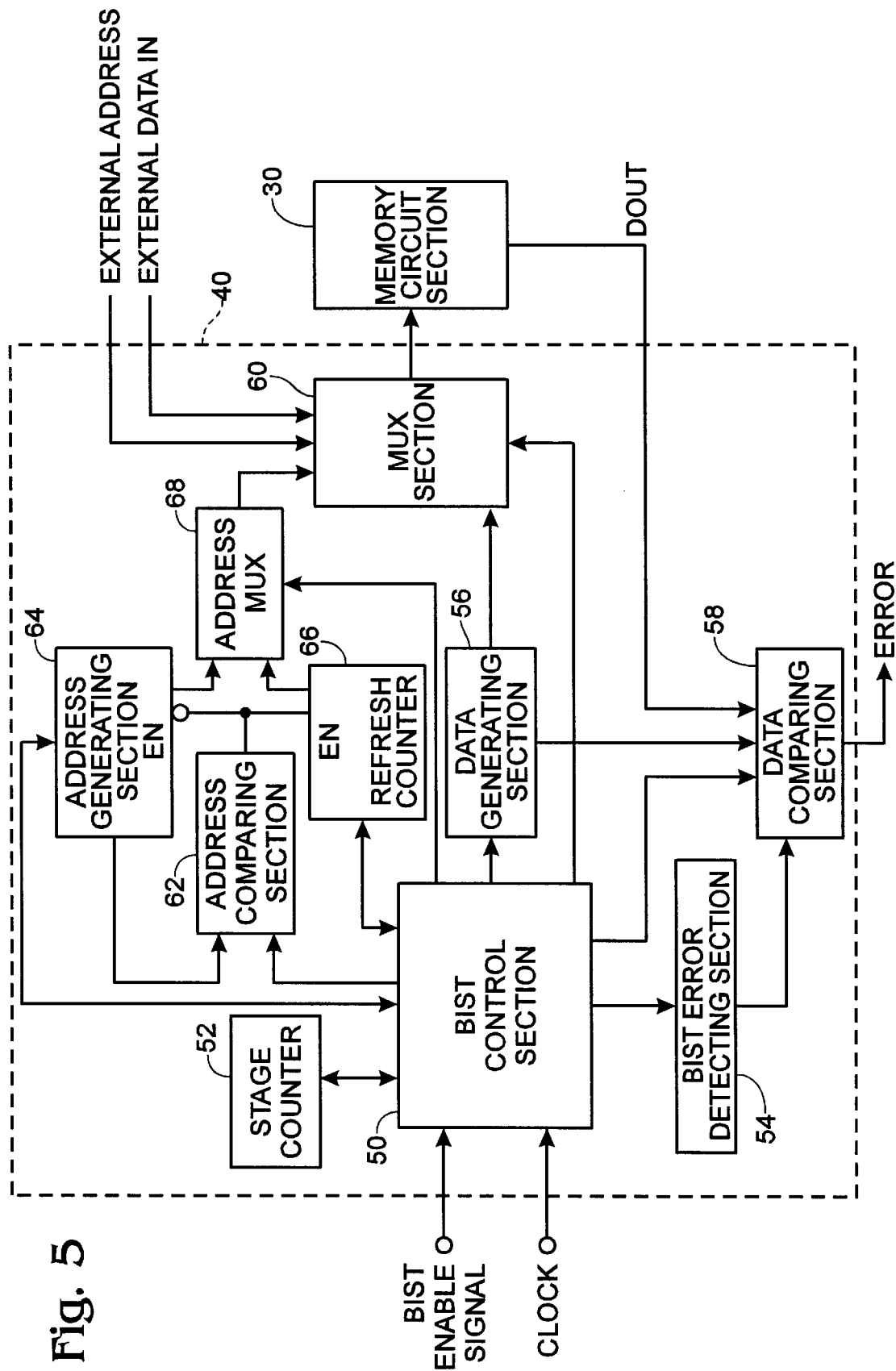
FIG. 5 is a block diagram of a semiconductor memory device having a test circuit according to one embodiment of the present invention.

FIG. 5 shows the structure of a semiconductor integrated circuit having a test circuit according to the present invention. The semiconductor integrated circuit of FIG. 5 is composed of a test circuit section 40 and a memory circuit section 30. The memory circuit section 30 is an embedded dynamic random access memory (DRAM).

The test circuit section 40 includes a stage counter 52, a BIST error detecting section 54, a data comparing section 58, a multiplexer (MUX) section 60, an address generating section 64 for generating the addresses for testing memory circuit section 30, a data generating section 56 for generating the test data for testing the memory circuit section, an address comparing section 62 for comparing and detecting if the address generated from the address generating section 64 matches a refresh point address, and disabling the address generating section if the generated address is identical to the refresh point address, a refresh address generating section 66 for generating a refresh address for refreshing the memory circuit section 30 if the address generated by address generating section 64 matches to the refresh point address as a result of comparison in address comparing section 62, an address MUX 68 for selecting the output from either the address generating section 64 or the refresh address generating section 66 in response to an address control signal input thereto, and a BIST control section 50 for testing memory circuit section 30 and which controls address generating section 64 and data generating section 56 in the test mode. The BIST control section determines the number of refresh cycles to be performed if the time period for accessing a cell of the memory circuit section 30 is greater than the refresh time required for a pre-designed specification during the testing operation, and which determines and provides the refresh point address to the comparing section 62, and which provides the address control signal to the address MUX 68.

Figure 6:
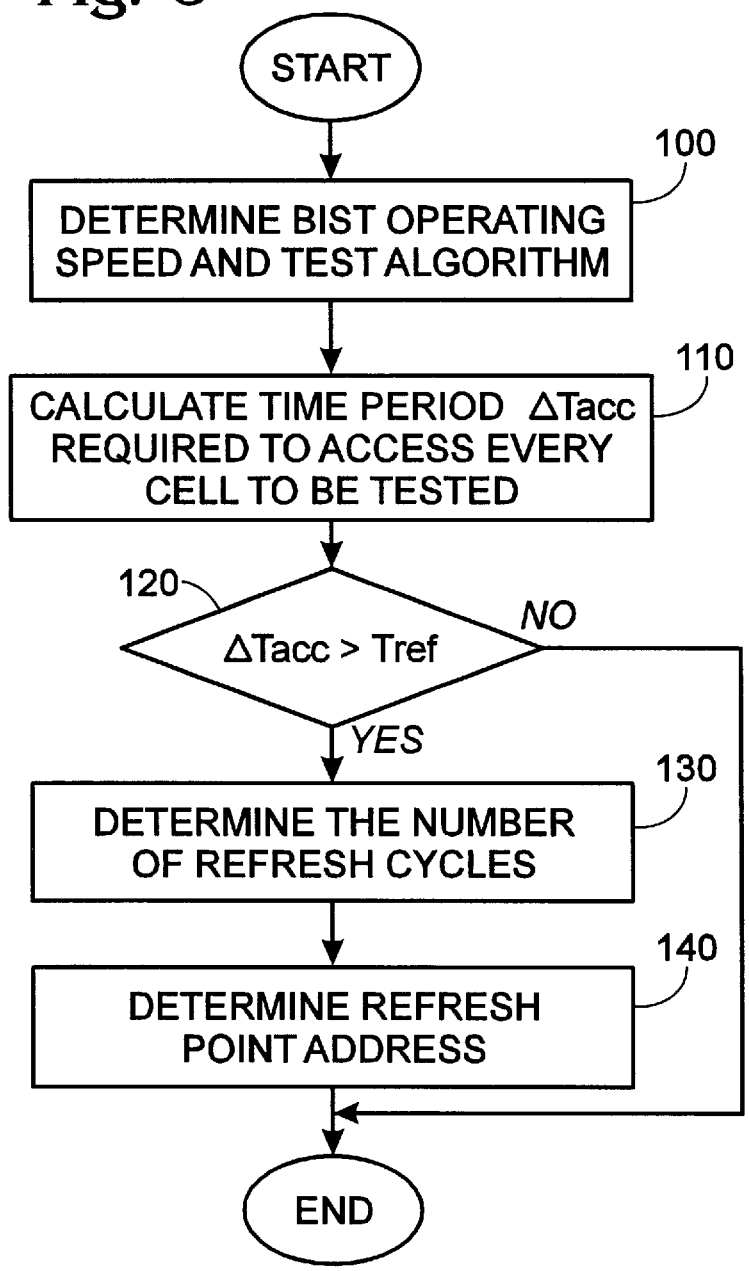
FIG. 6 is a flow chart illustrating the method for determining the number of refresh cycles implemented by the BIST control circuit of FIG. 5.

FIG. 6 is flow chart describing the test method according to the present invention. Referring to FIG. 6, the operating speed of the test circuit section and the test algorithm are first determined (step 100). Then the time period $\Delta Tacc$ for every cell of the memory circuit section 30 to be accessed in the test algorithm is calculated (step 110). Thereafter, in step 120, it is determined whether $\Delta Tacc$ is greater than Tref (i.e., $\Delta Tacc>Tref$?) where Tref denotes the refresh time required by the memory circuit section 30. If it is determined at step 120 that $\Delta Tacc$ is greater than Tref, then the number of refresh cycles Nref necessary during each stage of the test algorithm is determined in step 130 from the expression $[\Delta Tacc/Tref]-1$.

By way of another example, if a march test algorithm is performed by the BIST circuit 40, then the cells of memory circuit section 30 are sequentially accessed by incrementing or decrementing the address output by address generating section 64. Since the addresses accessed during the march test algorithm can be determined, the number of refresh cycles Nref required during each stage of the march test algorithm can also be determined. Therefore, the refresh point address is determined in step 140 based upon the test algorithm and the number of refresh cycles Nref. By way of further example, if the maximum address to be tested in memory circuit section 30 is 100 and the number of refresh cycles is 1, then the refresh point address is determined to be 50. Similarly, if the number of refresh cycles Nref is 2, then the refresh point addresses are determined to be 25 and 75.

Figure 7:
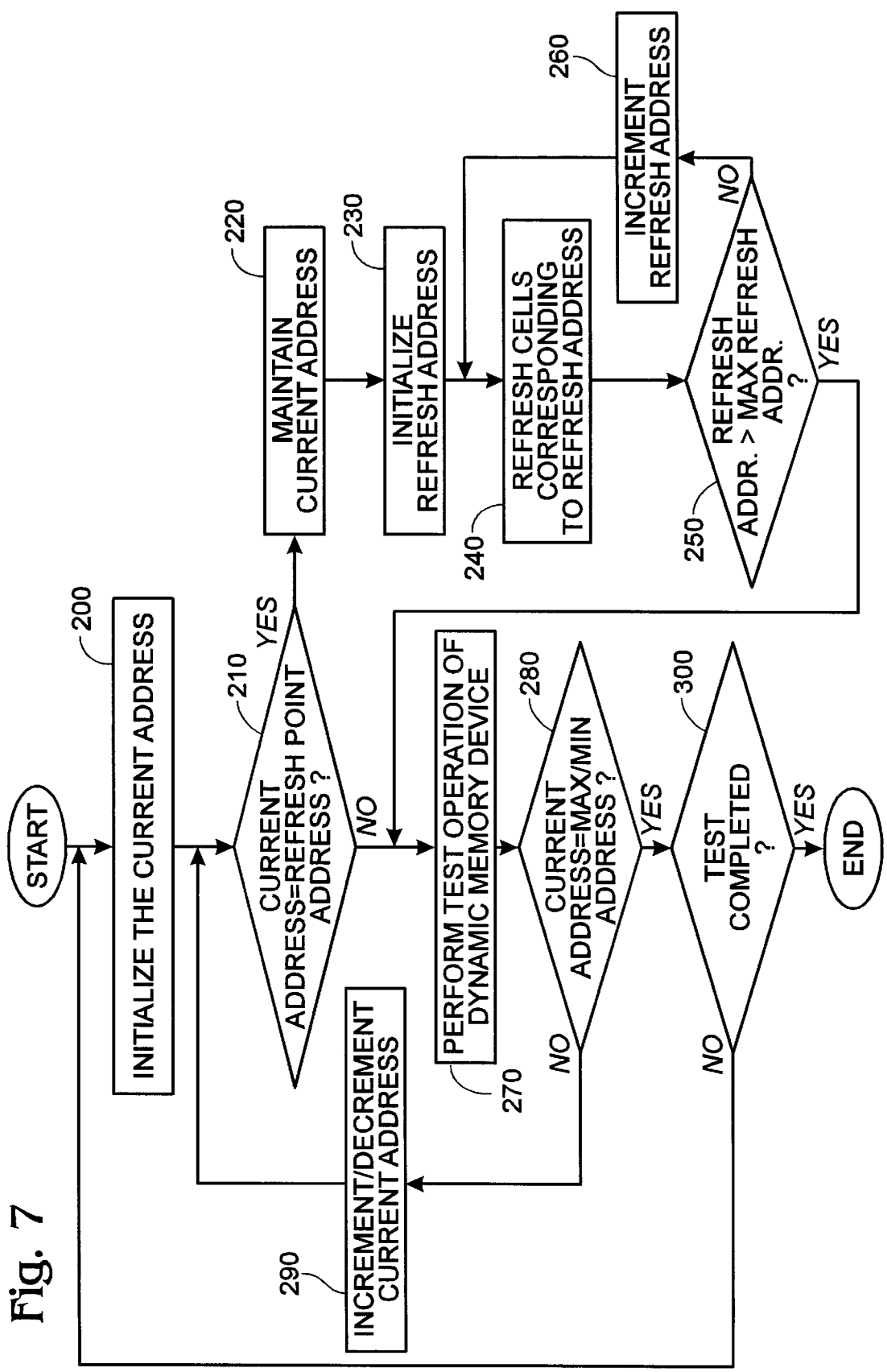
FIG. 7 is flow chart illustrating the refresh operation of the test circuit of the semiconductor memory device according to the present invention.

FIG. 7 is a flow chart illustrating the refresh operation of test circuit 50 of FIG. 5. Referring to FIG.7, in step 200, a current address is initialized to a starting address for the test algorithm by initializing the address generating section 64. Then, in step 210, comparing section 62 compares the current address with the refresh point address determined by the BIST control section 50. If the current address does not equal the refresh point address, then, in step 270, address generating section 64 generates a test address and address multiplexer 68 outputs the test address to memory circuit section 30 under the control of BIST control section 50. The BIST control section 50 then determines if the current address is identical to the maximum/minimum address of the memory circuit section 30 (step 280). If it is determined that the current address does not match the maximum/minimum address at step 280, then the current address is incremented/decremented by address generating section 64 (step 290) and execution proceeds back to step 210. If it is determined in step 280 that the maximum/minimum address has been reached, then execution proceeds to step 300 for a determination of whether the test algorithm has been completed. If the test algorithm has not been completed, then another stage of the test algorithm must be executed and execution flow proceeds back to step 200. If the test algorithm is complete, then the test operation is terminated in step 300.

If, however, it is determined in step 210 that the current address matches the refresh point address, then BIST control section 50 disables the address generating section 64 in order to maintain the current address (step 220) and then initializes refresh counter 66 with a refresh address (step 230). The address multiplexer 68 outputs the value of the refresh counter 66 under the control of BIST control section 50. The BIST control section 50 compares and detects whether the refresh address is greater than a maximum refresh address (step 240). If it is detected that the refresh address is not greater than the maximum refresh address at step 240, then refresh counter 66 increments the refresh address in step 260 and execution proceeds to step 240. If it is determined that the refresh address is greater than the maximum refresh address at step 240, then BIST control section 50 terminates the refresh operation and execution of the test operation resumes at step 270.

The BIST control section 50 generates the control signals for the operation of the memory circuit section 30 during the test operation. Typically, the test algorithm used for testing memory circuit section 30 is the march test. The increment or decrement of the address in step 290 and the comparison of the current address with the maximum or minimum address in step 280 are portions of a test operation according to the march test algorithm. A test operation of the memory circuit section 30 according to the march test algorithm can be completed by performing the steps described above.

Therefore, the test circuit of the present invention determines the number of refresh cycles and the refresh point address based upon the test algorithm and number of refresh cycles in order to effectively refresh the memory circuit section during the test operation.

Figure 8:
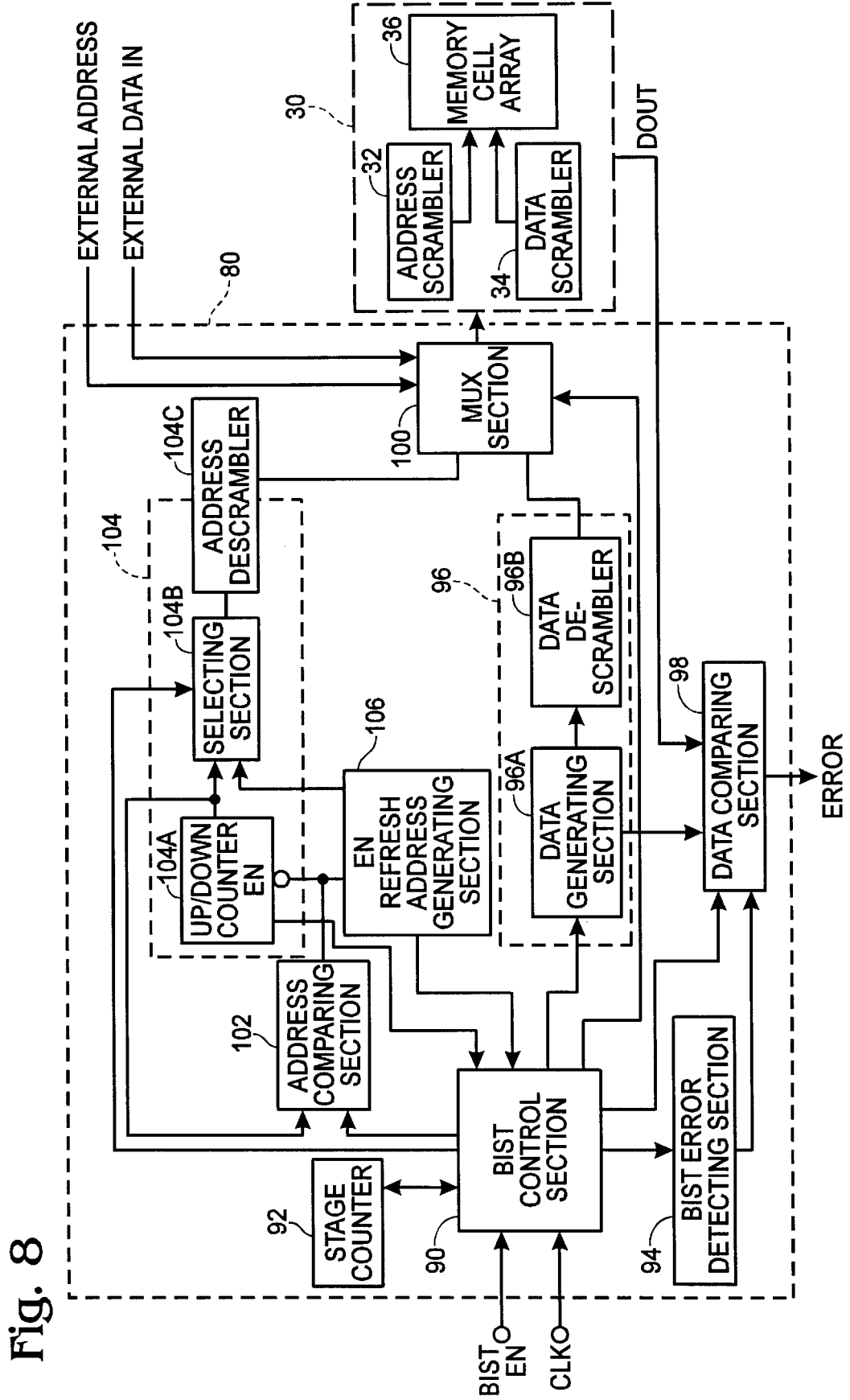
FIG. 8 is a block diagram of the semiconductor memory device having a test circuit according to another embodiment of the present invention.

FIG. 8 shows the structure of the semiconductor integrated circuit having a test circuit according to another embodiment of the present invention. The semiconductor integrated circuit of FIG. 8 includes a test circuit section 80 and the memory circuit section 30.

As described above, conventional memory circuit section 30 is provided with an address scrambling section 32 for scrambling an input address signal, a data scrambling section 34 for scrambling input data, and a memory cell array 36 for storing the data from the data scrambling section 34 in the address provided from the address scrambling section 32.

Test circuit section 80 is provided with a stage counter 92, a BIST error detecting section 94, a comparing section 98, a multiplexer section 100, an address counting section 104A for sequentially counting the test addresses for testing memory circuits section 30, an address descrambling section 104C for descrambling the test address prior to inputting to the memory circuit section 30, a data generating section 96A for generating test data for memory circuit section 30, a data descrambling section 96B for descrambling the test data before inputting it to memory circuit section 30, a comparing section 102 for comparing if the address generated from the address counting section 104A with the refresh point address, and disabling the address counting section 104A if the generated address matches the refresh point address, a refresh address generating section 106 for generating a refresh address for refreshing the memory circuit section 30 if the generated address matches the refresh point address, a selecting means 104B for selecting either the address from address counting section 104A or the address from the refresh address generating section 106 for input to address descrambling section 104 in response to an address control signal, and a BIST control section 90 for testing the memory circuit section 30 by controlling the address counting section 104A and the data generating section 96 in accordance with a test algorithm in a test operation, determining the number of refresh cycles required if a time period for accessing a cell of the memory circuit section 30 for each stage of the test algorithm is greater than a refresh time required for a memory cell array 36, determining the refresh point address for address comparing section 102, and providing the address control signal to selecting section 104B.

The descrambling function of the embodiment of the present invention show in FIG. 8 is explained below.

An address from a source external to the semiconductor memory device is called the external or logical address, and the address used for actually accessing a cell in memory cell array 36 is called the physical or topological address. The process of converting the logical address into the topological address is called address scrambling. As discussed above with regard to FIGS. 2, 3A and 3B, the output signals Q0 to Q8 supplied by the external address will typically be row address signals, and the row address bit signals RA0 to RA8 will be the actual address signal of the memory cell array 36.

Viewed from outside the semiconductor memory device, the data input to a logical address of the device is called the logical data, and the data which is actually stored in the dynamic memory cell array is called the topological data. The term data scrambling refers to the conversion of logical data into topological data and vice versa.

Data scrambling follows a prescribed rule for each given address. The semiconductor memory device scrambles the data in relation to a row address, but not in relation to the column address or the data path. As shown in Table 1 below, if the value of the row address bit RA0 is "0", the corresponding cell is treated as a true cell, while if the value of the address bit RA0 is "1", the corresponding cell is treated as a complement cell.

TABLE 1

| RA0 | External data | Topological data | Type of cell |
|---|---|---|---|
| 0 | 0 | 1 | True cell |
|   | 1 | 0 |   |
| 1 | 0 | 0 | Complement cell |
|   | 1 | 1 |   |

Accordingly, if the 8-bit external data is "10101010", and the least significant bit RA0 of the row address signal is "0", the data to be written in the memory cell will be "01010101". If the least significant bit RA0 is "1", the data to be written in the memory cell will be "10101010".

Specifically, if data is to be inputted through the data scrambler by operation of the data and address scramblers described above, and all the row address bits are "0000000", the data to be written in the memory cell will be determined with reference to Table 2 below.

TABLE 2

| Output signal of row address generating section | Output signal of row address scrambler | Memory cell address | Data to be written in memory cell |
|---|---|---|---|
| 000000000 | 000000001 | 1 | 10101010 |
| 000000001 | 000000000 | 0 | 01010101 |
| 000000010 | 000000010 | 2 | 01010101 |
| 000000011 | 000000011 | 3 | 10101010 |
| — | — | — | — |

As shown in Table 2, if the external row address signal is "000000000", the data "10101010" is written in the cells whose memory cell address is "1", and if the row address signal is "000000001", the data "01010101" is written in the cells whose memory cell address is "0". If the row address signal is "000000011", the data "01010101" is written in the cells whose memory cell address is "2". If the external row address signal is "000000010", the data "10101010" is written in the cell whose memory cell address is "3".

Referring again to FIG. 8, the address generating section 104 in memory circuit section 80 includes an address descrambler 104C coupled to the output of address selecting section 104B. In addition, data generating section 96 includes a data descrambler 96B coupled to the output of data generator 96A. As a result, the test circuit of a semiconductor memory device according to the present invention features address and data descramblers coupled to the output of the address generating circuit and the data generating circuit, respectively.

To describe an example of the function of the test circuit of FIG. 8 in further detail, the data to be written in the memory cell array in the event that the output signal of the data generating section 96A is "10101010", and the row address output by up/down counter 104A is "0000000" is illustrated in Table 3 below.

TABLE 3

| Output signal of row address generating section | Output signal of address descrambler | Output signal of data descrambler | Output signal of row address scrambler | Memory cell address | Data to be written in memory cell |
|---|---|---|---|---|---|
| 000000000 | 000000001 | 10101010 | 000000000 | 0 | 10101010 |
| 000000001 | 000000000 | 01010101 | 000000001 | 1 | 10101010 |
| 000000010 | 000000010 | 01010101 | 000000010 | 2 | 10101010 |
| 000000011 | 000000011 | 10101010 | 000000011 | 3 | 10101010 |

As shown in Table 3, the address from up/down counter 104A coincides with the memory cell address in the memory cell array 36, and the data from data generating section 96A coincides with the data written in the memory cell array 36.

Though the present invention has been described herein with reference to the specific embodiments thereof, various changes and modifications can be made in the combination of the refresh function and the scrambling technique. For instance, various combinations incorporating the scrambling of the address only, the scrambling of the data only, or the scrambling of both the address and data are possible.

From the foregoing, the test circuit of a semiconductor integrated circuit according to the present invention can accurately perform a refresh operation with respect to test data and generate the test address and test data which accommodates the scrambling function within a typical memory circuit section, thereby improving the test function of the semiconductor integrated circuit.

What is claimed is:

1. A semiconductor integrated circuit having a test circuit section and a memory circuit section, the semiconductor integrated circuit comprising:

an address generating circuit configured to generate a testing address for testing said memory circuit section;

a data generating circuit configured to generate test data for testing said memory circuit section;

a refresh address generating circuit configured to generate a refresh address for refreshing said memory circuit section when the generated address matches a refresh point address;

an address multiplexer configured to select one of the test address and the refresh address responsive to an address control signal; and a built-in self test control circuit configured to execute a predetermined test algorithm and control said address generating circuit and said data generating circuit responsive to the test algorithm, and the control circuit being further configured to determine whether a time period for accessing a cell of said memory circuit section is greater than a predetermined refresh time required for the memory circuit section and to calculate a corresponding refresh point address, and the control circuit being still further configured to compare the test address to the refresh point address and disable said address generating circuit and enable said refresh address generating circuit when the test address matches the refresh point address, and the control circuit being yet still further configured to provide the address control signal to the address multiplexer such that the test address is output to the memory circuit section when said address generating circuit is enabled and the refresh address is output to the memory circuit section when said refresh address generating circuit is enabled.

2. A semiconductor integrated circuit as claimed in claim 1, wherein said test circuit section performs a march test algorithm and the number of refresh cycles corresponds to a time period for accessing a given address.

3. A semiconductor integrated circuit as claimed in claim 1, wherein said memory circuit section comprises an embedded dynamic random access memory.

4. A test method for a semiconductor integrated circuit having a test circuit section and a memory circuit section, the test method comprising the steps of:

calculating a refresh point address based upon a time period required to complete a predetermined test algorithm on the memory circuit section and a predetermined refresh time required to maintain data stored in the memory circuit section;

generating a test address and test data for testing a cell in the memory circuit section;

comparing the test address with the refresh point address;

holding the test address when the test address matches the refresh point address;

performing a refresh operation to refresh the data stored in memory circuit section beginning with the refresh point address when the test address matches the refresh point address; and resuming the test algorithm at the test address after termination of the refresh operation.

5. The method of claim 4, wherein the step of generating a test address and test data for testing a cell in the memory circuit section further includes the steps of:

descrambling the test address before inputting the test address into the memory circuit section; and descrambling the test data before inputting the test data into the memory circuit section.

6. A test method for a semiconductor integrated circuit having a test circuit section and a memory circuit section, wherein the memory circuit section includes logic for scrambling an address and a data signal input to the memory circuit section, the test method comprising the steps of:

generating a test address and test data for testing a cell in the memory circuit section;

descrambling the test address before inputting the test address into the memory circuit section; and descrambling the test data before inputting the test data into the memory circuit section.

7. A semiconductor integrated circuit, the circuit comprising:

a memory circuit section having an address scrambling circuit adapted to scramble an input address signal, a data scrambling circuit adapted to scramble an input data signal, and a memory cell array adapted to store scrambled data output from the data scrambling circuit in cells corresponding to scrambled addresses output from the address scrambling circuit; and a test circuit section coupled to the memory circuit section and further comprising:
  an address counting circuit adapted to sequentially count a test address for testing said memory circuit section;
  an address descrambling circuit adapted to descramble the test address output from the address counting circuit to produce a descrambled test address which is output as the input address signal to the address scrambling circuit of the memory circuit section such that the test address matches the address of the memory cell array;
  a data generating circuit adapted to generate test data for testing the memory circuit section;
  a data descrambling circuit adapted to descramble the test data output from the data generating circuit to produce the input data signal to the memory circuit section such that the test data matches the data stored in the memory cell array for a given test address; and
  a built-in self test (BIST) control circuit being enabled by an external test enable signal, and operating in response to an external clock signal, wherein the BIST control circuit executes a test algorithm on the memory circuit section by controlling said address counting circuit and said data generating circuit in accordance with the test algorithm.

8. The semiconductor integrated circuit of claim 7, wherein the test circuit section includes:
  a refresh address generating circuit configured to generate a refresh address for refreshing said memory circuit section when the generated address matches a refresh point address;
  an address multiplexer configured to select one of the test address and the refresh address responsive to an address control signal generated by the BIST control circuit; and
  wherein the BIST control circuit is further configured to determine whether a time period for accessing a cell of said memory circuit section is greater than a predetermined refresh time required for the memory circuit section and to calculate the refresh point address based upon the test algorithm and the predetermined refresh time, and the control circuit being still further configured to compare the test address to the refresh point address and disable said address generating circuit and enable said refresh address generating circuit when the test address matches the refresh point address, and the control circuit being yet still further configured to provide the address control signal to the address multiplexer such that the test address is output to the memory circuit section when said address generating circuit is enabled and the refresh address is output to the memory circuit section when said refresh address generating circuit is enabled.

* * * * *